US012560668B2

(12) United States Patent
Ge et al.

(10) Patent No.: US 12,560,668 B2
(45) Date of Patent: Feb. 24, 2026

(54) MAGNETIC RESONANCE SYSTEM, SURFACE COIL, PHYSIOLOGICAL MOTION SENSING APPARATUS AND GATING METHOD THEREOF

(71) Applicant: GE Precision Healthcare LLC, Wauwatosa, WI (US)

(72) Inventors: Yaan Ge, Beijing (CN); Qingyu Dai, Beijing (CN); Yuan Li, Beijing (CN); Kun Wang, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 443 days.

(21) Appl. No.: 18/295,711

(22) Filed: Apr. 4, 2023

(65) Prior Publication Data

US 2023/0349998 A1    Nov. 2, 2023

(30) Foreign Application Priority Data

Apr. 29, 2022    (CN) .......................... 202210464581.9

(51) Int. Cl.
  *G01R 33/567*    (2006.01)
  *G06N 3/08*    (2023.01)

(52) U.S. Cl.
  CPC .......... *G01R 33/5673* (2013.01); *G06N 3/08* (2013.01)

(58) Field of Classification Search
  None
  See application file for complete search history.

(56) References Cited

U.S. PATENT DOCUMENTS

2014/0097844 A1*  4/2014  Tomiha .............. G01R 33/3692
                                                      324/321
2015/0265161 A1*  9/2015  Hernandez ........... A61B 5/0816
                                                      600/483

* cited by examiner

*Primary Examiner* — Farhana A Hoque

(57)    ABSTRACT

The physiological motion sensing apparatus for a magnetic resonance system includes: a sensor module, positioned relative to an examined subject of the magnetic resonance system. The sensor module is configured to sense the motion of the examined subject to generate a sense signal and transmit the sense signal to a processor of the magnetic resonance system via a wireless medium. A power supply module is configured to supply power to the sensor module; and a shielding housing that forms a shielded space. The power supply module is provided in the shielded space.

19 Claims, 13 Drawing Sheets

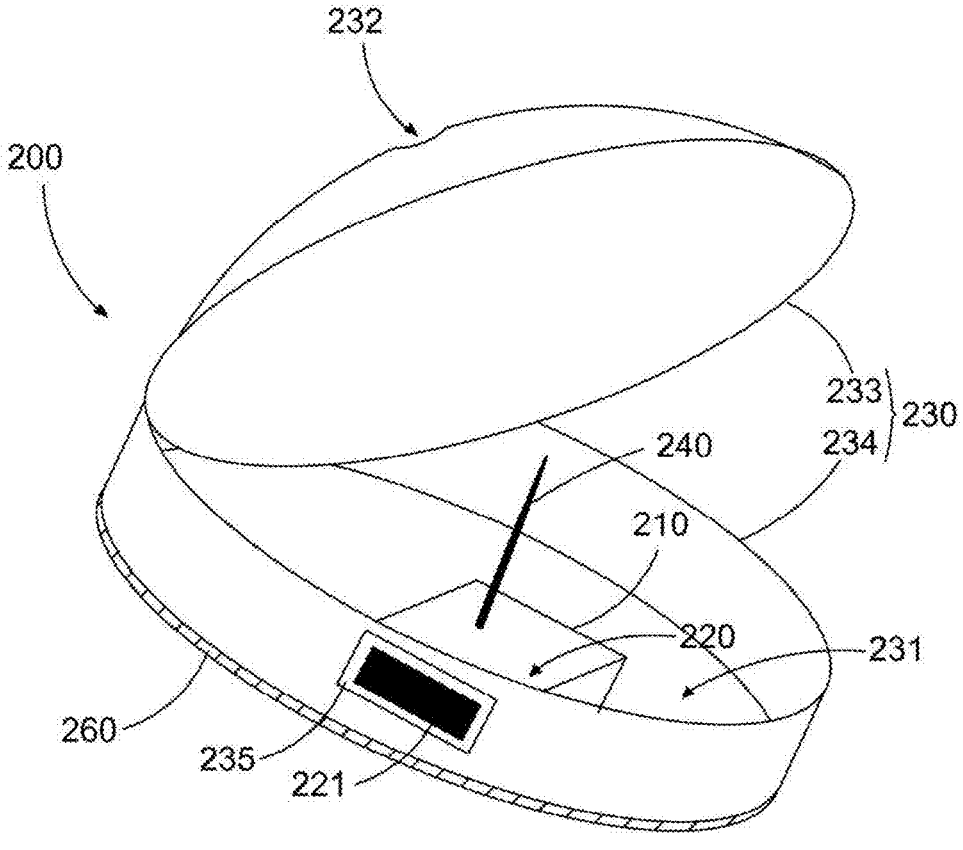
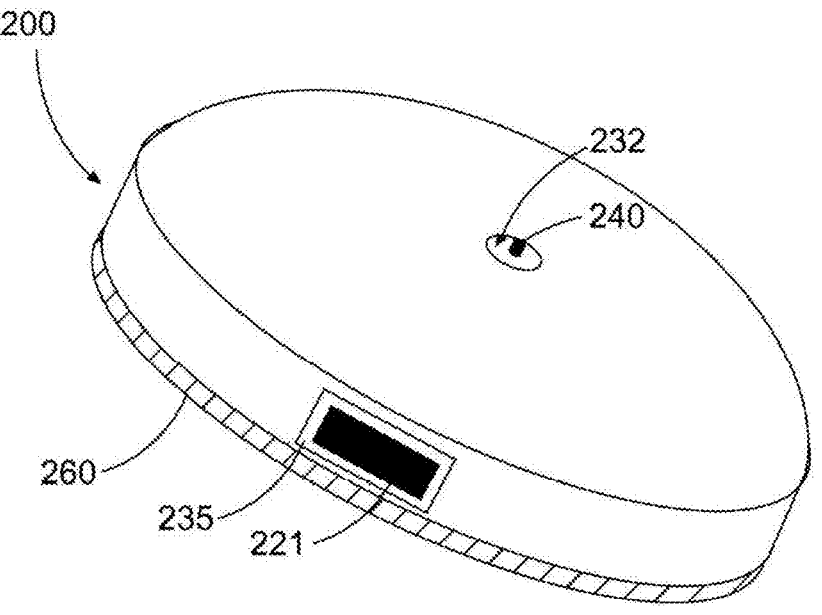
FIG. 3

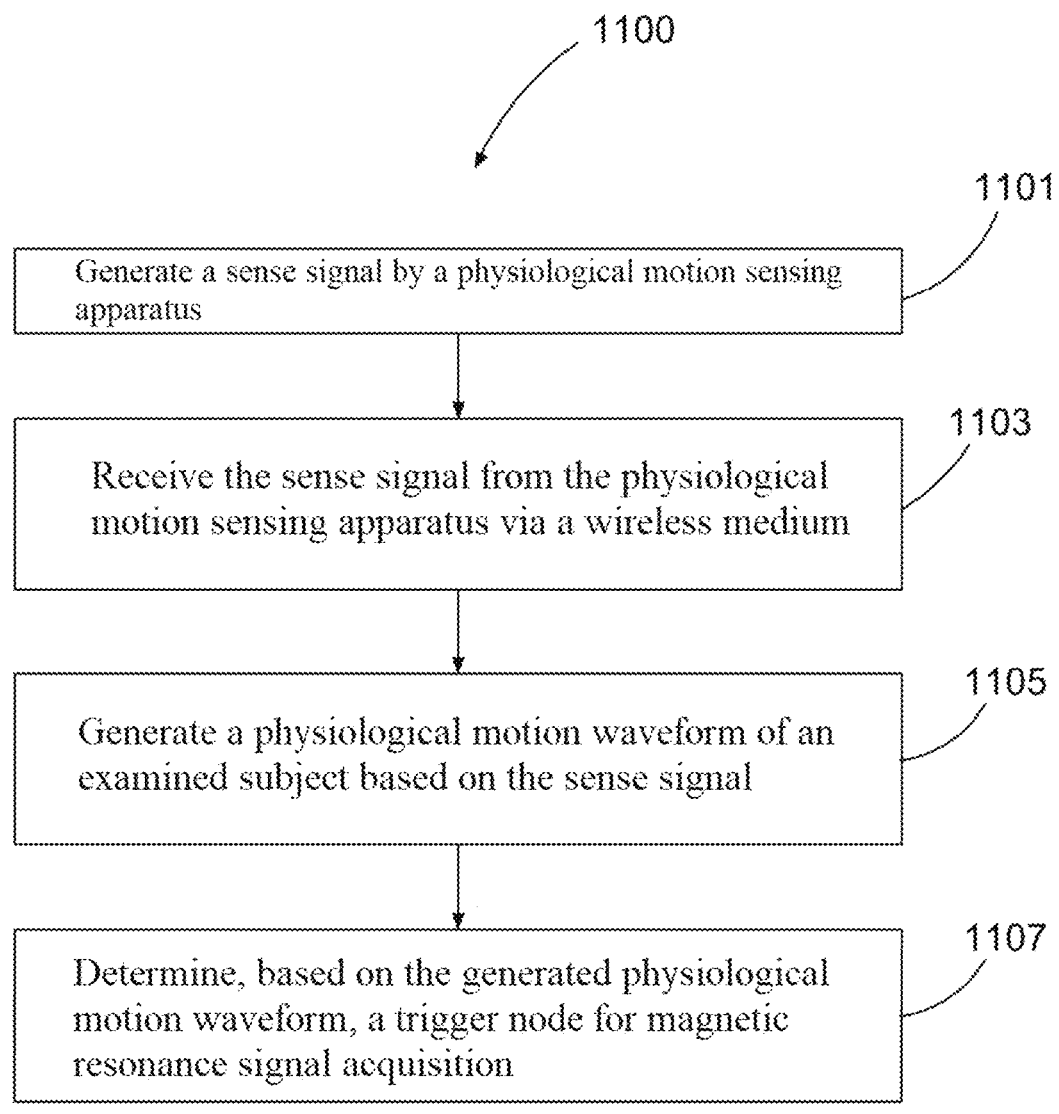

1100

1101

Generate a sense signal by a physiological motion sensing apparatus

1103

Receive the sense signal from the physiological motion sensing apparatus via a wireless medium

1105

Generate a physiological motion waveform of an examined subject based on the sense signal

1107

Determine, based on the generated physiological motion waveform, a trigger node for magnetic resonance signal acquisition

FIG. 11

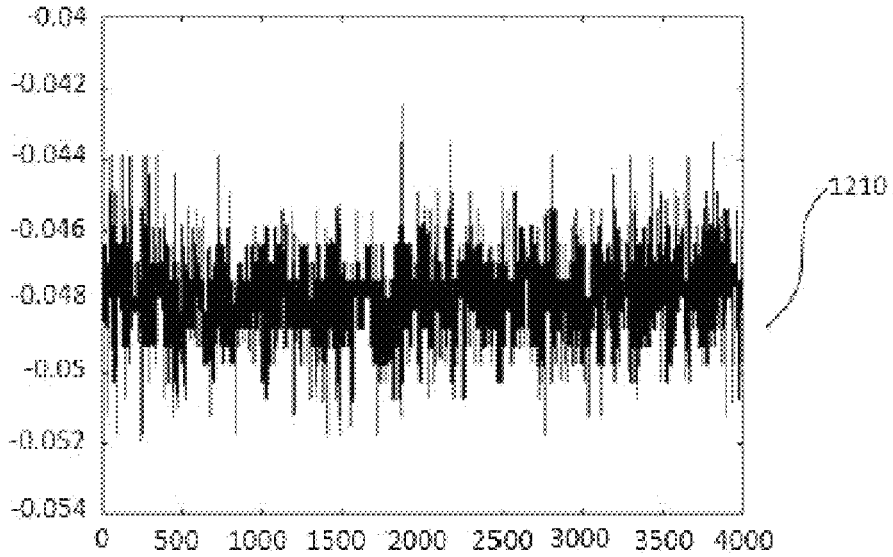
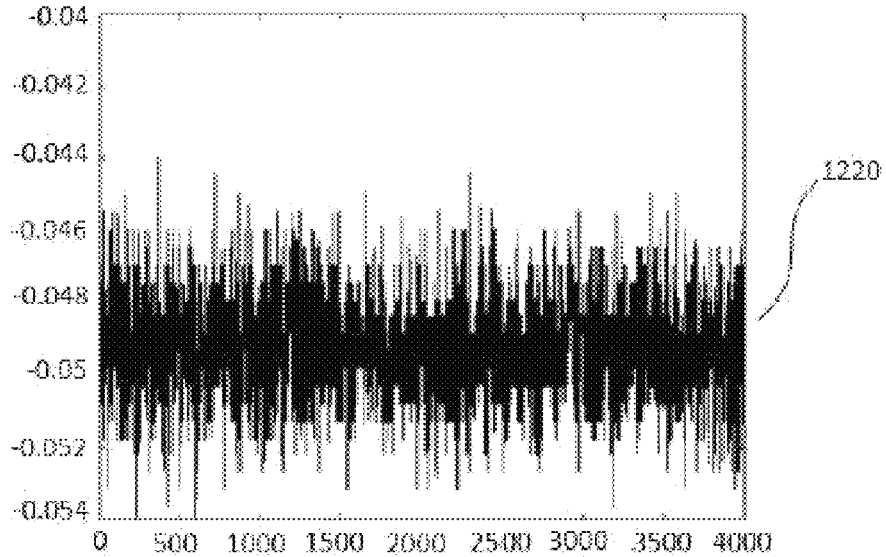
FIG. 12

MAGNETIC RESONANCE SYSTEM, SURFACE COIL, PHYSIOLOGICAL MOTION SENSING APPARATUS AND GATING METHOD THEREOF

CROSS REFERENCE

The present application claims priority and benefit of Chinese Patent Application No. 202210464581.9 filed on Apr. 29, 2022, which is incorporated herein by reference in its entirety.

FIELD OF THE INVENTION

The present invention relates to the field of medical imaging, and particularly to a magnetic resonance system, a physiological motion sensing apparatus for the magnetic resonance system, and a physiological motion gating method of the magnetic resonance system.

BACKGROUND OF THE INVENTION

Magnetic resonance imaging (MRI) is one of the major imaging modalities in modern medicine. MRI may be affected by physiological motions such as respiration and heartbeats and produce artifacts. Therefore, in the prior art, the acquisition of MR signals is usually triggered based on acquired physiological signals, for example, electrocardiographically (ECG)-triggered gating, pulse-triggered gating, respiratory-triggered gating, etc. Conventional physiological signal acquisition techniques either require close contact with the body of the subject and cause discomfort to the subject, require signal transmission through complex cables, are costly, cannot be applied to MR environments, or have difficulties when gating triggers based on different physiological movements are required at the same time. Therefore, it is desired to improve the physiological signal triggering scheme for MRI technology in order to bring about at least one of better cost-effectiveness, a more user-friendly experience and a better gating trigger effect.

BRIEF DESCRIPTION OF THE INVENTION

According to one aspect of the present invention, a physiological motion sensing apparatus for a magnetic resonance system is provided, wherein the apparatus comprises: a sensor module, positioned relative to an examined subject of the magnetic resonance system. The sensor module is configured to sense the motion of the examined subject to generate a sense signal and transmit the sense signal to a processor of the magnetic resonance system via a wireless medium. The physiological motion sensing apparatus further includes a power supply module is configured to supply power to the sensor module; and a shielding housing, forming a shielded space, the power supply module being provided in the shielded space.

Another aspect of the present invention provides a surface coil for a magnetic resonance system, the surface coil having the physiological motion sensing apparatus mounted thereon according to any of the foregoing aspects.

Another aspect of the present invention provides a surface coil for a magnetic resonance system, the surface coil being provided with a connecting part thereon, the connecting part of the surface coil being configured to mount the physiological motion sensing apparatus according to any of the foregoing aspects.

Another aspect of the present invention provides a magnetic resonance system, comprising: a scanner, configured to perform magnetic resonance scanning of an examined subject. The magnetic resonance system includes the physiological motion sensing apparatus according to any of the foregoing aspects; and a physiological acquisition processor. The physiological acquisition processor comprises a first processor configured to receive, via a wireless medium, the sense signal from the sensor module of the physiological motion sensing apparatus and generate a physiological motion waveform of the examined subject based on the sense signal.

Another aspect of the present invention provides a physiological motion gating method for a magnetic resonance system, comprising generating a sense signal based on the physiological motion sensing apparatus according to any of the foregoing aspects. The method further includes receiving the sense signal from the physiological motion sensing apparatus via a wireless medium; and generating a physiological motion waveform of the examined subject based on the sense signal.

It should be understood that the brief description above is provided to introduce, in simplified form, some concepts that will be further described in the detailed description. The brief description above is not meant to identify key or essential features of the claimed subject matter. The scope is defined uniquely by the claims that follow the detailed description. Furthermore, the claimed subject matter is not limited to implementations that solve any disadvantages noted above or in any section of the present disclosure.

BRIEF DESCRIPTION OF THE DRAWINGS

The present invention will be better understood by reading the following description of non-limiting embodiments with reference to the accompanying drawings, wherein

FIG. 3 illustrates a diagram of an exemplary structure of the physiological motion sensing apparatus 200 of FIG. 2.

FIG. 11 illustrates a flow chart of a physiological motion gating method for a magnetic resonance system according to some embodiments of the present invention.

FIG. 12 illustrates a sense signal 1210 which is acquired based on an embodiment of the present invention when MR scanning is not performed and a sense signal 1220 which is acquired based on an embodiment of the present invention when MR scanning is performed, respectively.

The accompanying drawings illustrate components, systems, and methods described in the magnetic resonance imaging method and system. Together with the following description, the accompanying drawings illustrate and explain structural principles, methods and principles described herein. In the accompanying drawings, the thickness and dimensions of the components may be enlarged or otherwise modified for clarity. Well-known structures, materials, or operations are not shown or described in detail to avoid obscuring the components, systems, and methods described.

DETAILED DESCRIPTION

Specific embodiments of the present invention will be described below. It should be noted that in the specific description of these embodiments, for the sake of brevity and conciseness, this specification may not describe all features of the actual embodiments in detail. It should be understood that in the actual implementation process of any embodiments, just as in the process of any engineering project or design project, a variety of specific decisions are often made to achieve specific goals of the developer and to meet system-related or business-related constraints, which may also vary from one embodiment to another. Furthermore, it should also be understood that although efforts made in such development processes may be complex and tedious, for those of ordinary skill in the art related to the content disclosed in the present invention, some design, manufacture, or production changes based on the technical content disclosed in the present disclosure are only common technical means, and should not be construed as insufficient content of the present disclosure.

Unless otherwise defined, the technical or scientific terms used in the claims and the description are as they are usually understood by those of ordinary skill in the art to which the present invention pertains. Terms such as "first," "second," and similar terms used in this specification and claims do not denote any order, quantity, or importance, but are only intended to distinguish different constituents. The terms "one" or "a/an" and similar terms do not denote a limitation of quantity, but rather the presence of at least one. The terms "include" or "comprise" and similar terms mean that an element or article preceding the term "include" or "comprise" encompasses elements or articles and their equivalent elements listed after "include" or "comprise," and does not exclude other elements or articles. The terms "connect" or "connected" and similar words are not limited to physical or mechanical connections, and are not limited to direct or indirect connections. Furthermore, it should be understood that references to "an embodiment" or "embodiments" of the present disclosure are not intended to be construed as excluding the existence of additional implementations that also incorporate the referenced features.

Figure 1:
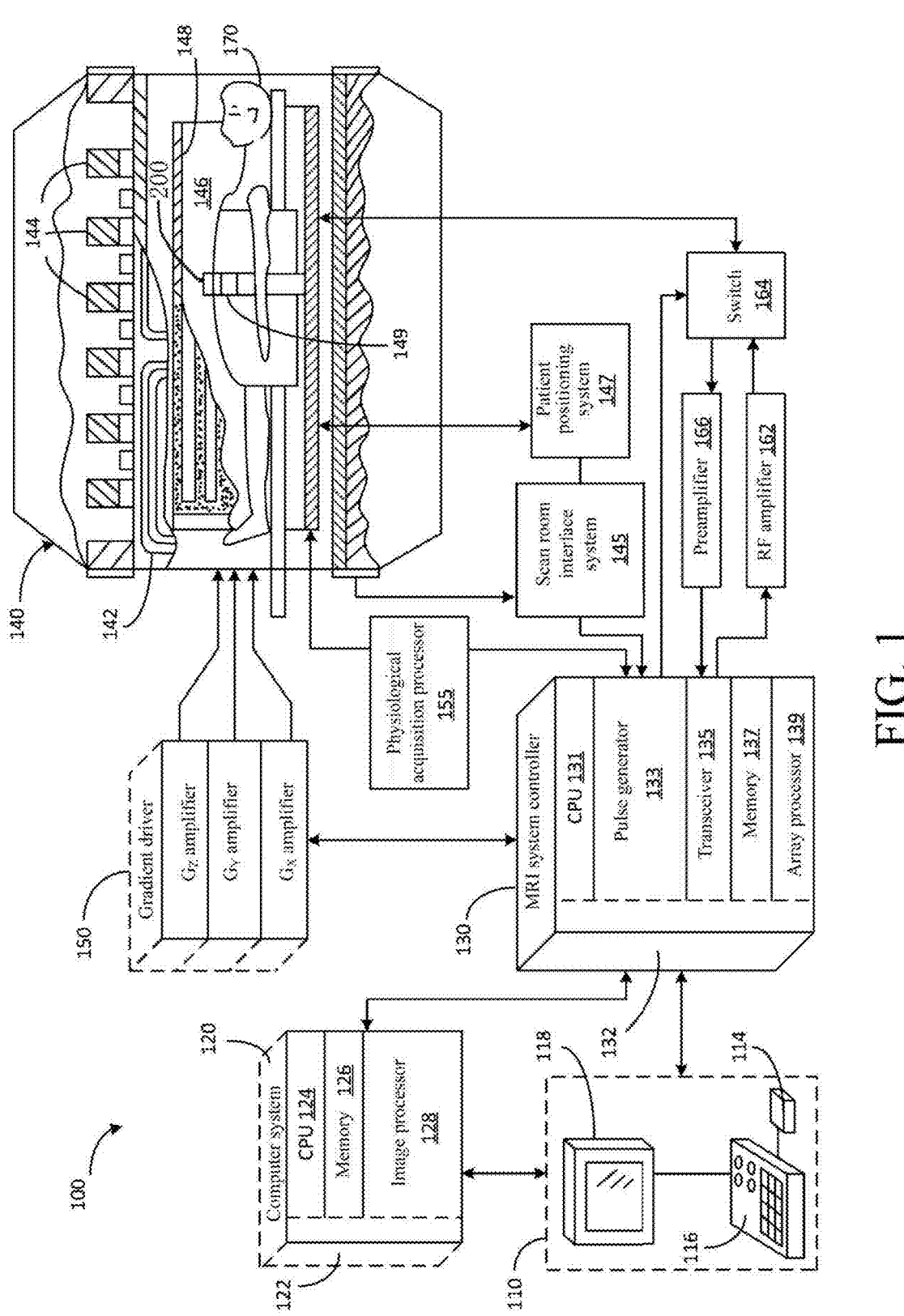
FIG. 1 illustrates an exemplary MRI system 100 according to some embodiments of the present invention.

Referring to FIG. 1, a schematic diagram of an exemplary magnetic resonance imaging (MRI) system 100 according to some embodiments is shown. The operation of the MRI system 100 is controlled by an operator workstation 110 that includes an input device 114, a control panel 116, and a display 118. The input device 114 may be a joystick, a keyboard, a mouse, a trackball, a touch-activated screen, a voice control, or any similar or equivalent input device. The control panel 116 may include a keyboard, a touch-activated screen, a voice control, a button, a slider, or any similar or equivalent control device. The operator workstation 110 is coupled to and in communication with a computer system 120 that enables the operator to control (e.g., through the input device) the generation and viewing of images on the display 118, and also to perform human-computer interaction through the user interface displayed on the display 118. The human-computer interaction can be used to: determine scan parameters, perform operations for image processing, select images and view quality assessment results for the selected images, etc. The computer system 120 includes various components that communicate with one another via an electrical and/or data connection module 122. The connection module 122 may be a direct wired connection, a fiber optic connection, a wireless communication link, etc. The computer system 120 may include a central processing unit (CPU) 124, a memory 126, and an image processor 128. In some embodiments, the image processor 128 may be replaced by image processing functions implemented in the CPU 124. The computer system 120 may be connected to an archive media device, a persistent or backup memory, or a network. The computer system 120 may be coupled to and in communication with a separate MRI system controller 130.

The MRI system controller 130 includes a set of components that communicate with one another via an electrical and/or data connection module 132. The connection module 132 may be a direct wired connection, a fiber optic connection, a wireless communication link, etc. The MRI system controller 130 may include a CPU 131, a sequence pulse generator 133 which is in communication with the operator workstation 110, a transceiver (or an RF transceiver) 135, a memory 137, and an array processor 139.

The subject 170 of the MRI scan may be positioned within the cylindrical imaging volume 146 of a resonance assembly 140. The resonance assembly 140 includes a superconducting magnet having a superconducting coil 144, and the resonance assembly 140 may also include a gradient coil 142 and an RF body coil 148. The superconducting coil 144 provides a static uniform longitudinal magnetic field B_0 through the cylindrical imaging volume 146 during operation.

The MRI system controller 130 may receive a command from the operator workstation 110 to indicate an MRI scan sequence to be executed during an MRI scan. RF excitation pulses in the scan sequence indicated by the MRI system controller 130 may be generated via the transceiver 135, and the RF excitation pulses are amplified by an RF amplifier 162 and provided to the RF body coil 148 via a transmit/receive switch (T/R switch) 164, and the RF body coil 148 then provides a transverse magnetic field B_1, the transverse magnetic field B_1 being substantially perpendicular to B_0 throughout the cylindrical imaging volume 146.

Gating trigger techniques are often used to trigger signal acquisition in imaging sequences, which may require real-time monitoring of respiratory and heartbeat vital sign signals and generating gating acquisition signals to trigger MR image acquisition when specific vital sign signals are detected, such as performing RF excitation to obtain MR signals having a high signal-to-noise ratio. In the case of cardiac MRI, for example, in order to eliminate artifacts, ECG gating techniques can be used, and the timing of data acquisition can be controlled to be in relatively stationary or stable periods of the heartbeat cycle, such as at the end of systole and/or mid-diastole of the heart cycle, to perform MR acquisition.

In some applications, ECG monitoring devices and ECG signals generated therefrom are strongly influenced by the strength of magnetic fields, causing determined trigger times to not match actual physiological motion cycles. Moreover, when acquiring ECG signals, setting electrodes on the body surface of the examined subject consumes more time and labor, and also makes the examined subject feel uncomfortable.

In addition, in some applications having high gating requirements, which may involve simultaneous use of heartbeat and respiratory motion for a gating trigger, the synchronization requirements for both are high and have brought more challenges.

In embodiments of the present invention, an improved physiological motion detection apparatus is provided to overcome the above difficulties. The physiological motion detection apparatus communicates with the physiological acquisition processor 155 arranged in the MR system, a detailed example of which will be described in detail below.

In embodiments of the present invention, the MRI system controller 130 receives signals from the physiological acquisition processor 155, and the physiological acquisition processor 155 includes a first processor which may receive signals from the physiological motion detection apparatus 200 according to the embodiments of the present invention, and the physiological motion detection apparatus 200 is positioned relative to the examined subject 170 receiving the MRI scan. As will be described in detail below, the physiological motion detection apparatus 200 is capable of generating a sense signal based on the physiological motion of the subject 170, and the first processor is configured to generate a physiological motion waveform of the subject 170 based on the sense signal.

In some embodiments of the present invention, the first processor may be provided in a scan room, such as in a housing for mounting the resonance assembly 140, and the first processor may communicate with the physiological motion detection apparatus 200 via a wireless medium, and may also communicate with devices outside the scan room (such as the MRI system controller 130), via a scan room interface system 145. In other embodiments of the present invention, the first processor may be provided outside of the scan room, for example, may be integrated in the MRI system controller 130, or may be independent of the system controller 130 and capable of communicating with the system controller 130.

The physiological acquisition processor 155 may also include a second processor that is capable of receiving data from the first processor 155. For example, the second processor may determine a trigger node for magnetic resonance signal acquisition based on the physiological motion waveform generated by the first processor.

In some embodiments of the present invention, the second processor may be provided outside of the scan room. For example, the second processor may be provided in an equipment room and integrated with the MRI system controller 130, or independent of the MRI system controller 130. In some embodiments, the second processor may also be provided in an operation room. When the first processor is provided in the scan room, the second processor can communicate with the first processor through the scan room interface system 145.

The MRI system controller 130 controls, based on the trigger node received from the physiological acquisition processor 155, the firing timing of the RF excitation pulses in the scan sequence.

A gradient waveform in the scan sequence indicated by the MRI system controller 130 may be generated and provided to the gradient driver system 150 via the sequence pulse generator 133, and the gradient driver system includes $G_x$, $G_y$ and $G_z$ amplifiers, etc. Each $G_x$, $G_y$ and $G_z$ gradient amplifier excites a corresponding gradient coil in the gradient coil assembly 142 so as to generate a magnetic field gradient used to spatially encode an MR signal during the MRI scan.

The sequence pulse generator 133 is coupled to and in communication with the scan room interface system 145, and the scan room interface system 145 receives signals from various sensors associated with the state of the resonance assembly 140 and various processors provided in the scan room. The scan room interface system 145 is further coupled to and in communication with a patient positioning system 147 that sends and receives signals to control movement of a patient table 1 to a desired position to perform the MRI scan. In some embodiments, the sequence pulse generator 133 may be integrated into the resonance assembly 140 of the MRI system 100.

The resonance assembly 140 may further include an RF surface coil 149 for imaging different anatomical structures of the patient undergoing the MRI scan. The RF body coil 148 and the RF surface coil 149 may be configured to operate in a transmit and receive mode, a transmit mode, or a receive mode.

As described above, the RF body coil 148 and the RF surface coil 149 may be used to transmit RF excitation pulses and/or receive resulting MR signals from the patient undergoing the MRI scan. The MR signals emitted by excited nuclei in the patient of the MRI scan may be sensed and received by the RF body coil 148 or the RF surface coil 149 and sent back to a preamplifier 166 through the T/R switch 164. The T/R switch 164 may be controlled by a signal from the MRI system controller 130 to electrically connect the RF amplifier 162 to the RF body coil 148 in the transmit mode and to connect the preamplifier 166 to the RF body coil 148 in the receive mode. The T/R switch 164 may further enable the RF surface coil 149 to be used in the transmit mode or the receive mode.

In some embodiments, the MR signals sensed and received by the RF body coil 148 or the RF surface coil 149 and amplified by the preamplifier 166 are stored in the memory 137 for post-processing as a raw k-space data array. A reconstructed magnetic resonance image may be obtained by transforming/processing the stored raw k-space data.

In some embodiments, the MR signals sensed and received by the RF body coil 148 or the RF surface coil 149 and amplified by the preamplifier 166 are demodulated, filtered, and digitized in a receiving portion of the transceiver 135, and transmitted to the memory 137 in the MRI system controller 130. For each image to be reconstructed, the data is rearranged into separate k-space data arrays, and each of these separate k-space data arrays is inputted to the array processor 139, which is operated to convert the data into an array of image data by Fourier transform.

The array processor 139 uses transform methods, most commonly Fourier transform, to create images from the received MR signals. These images are transmitted to the computer system 120 and stored in the memory 126. In response to commands received from the operator workstation 110, the image data may be stored in a long-term memory, or may be further processed by the image processor 128 and transmitted to the operator workstation 110 for presentation on the display 118.

In various embodiments, components of the computer system 120, the MRI system controller 130, and the physiological acquisition processor 155 may be implemented on the same computer system or on a plurality of computer systems. It should be understood that the MRI system 100 shown in FIG. 1 is intended for illustration. Suitable MRI systems may include more, fewer, and/or different components.

The MRI system controller 130, the image processor 128, and the physiological acquisition processor 155 may separately or collectively include a computer processor and a storage medium. The storage medium records a predetermined data processing program to be executed by the computer processor. For example, the storage medium may store a program used to implement scanning processing (such as a scan flow and an imaging sequence), image reconstruction, image processing, etc. For example, the storage medium may store a program used to implement the magnetic resonance imaging method according to the embodiments of the present invention. The storage medium may include, for example, a ROM, a floppy disk, a hard disk, an optical disk, a magneto-optical disk, a CD-ROM, or a non-volatile memory card.

Figure 2:
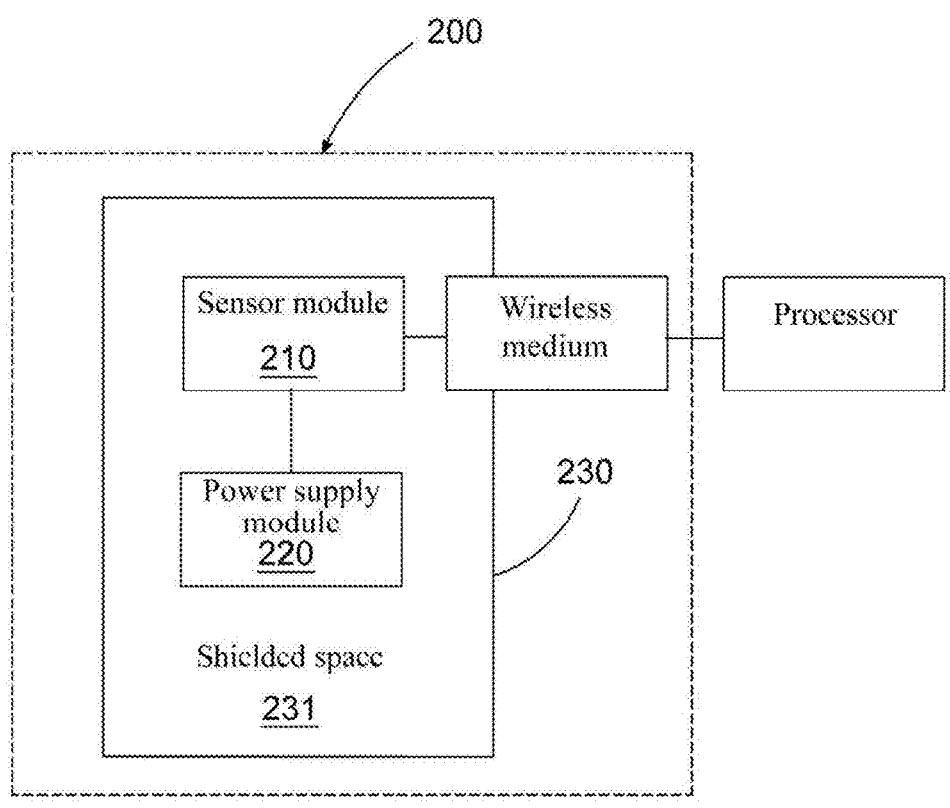
FIG. 2 illustrates a block diagram of a physiological motion sensing apparatus 200 according to some embodiments of the present invention.

FIG. 2 illustrates a block diagram of the physiological motion sensing apparatus 200 according to an embodiment of the present invention, and FIG. 3 illustrates a schematic diagram of the structure of the physiological motion sensing apparatus 200 in an embodiment, in which two states of the shielding housing, open and closed, are shown, respectively. The physiological motion sensing apparatus 200 includes the sensor module 210, the power supply module 220, and the shielding housing 230.

The sensor module 210 is positioned relative to the examined subject 170 of the MR system and is configured to sense the motion of the examined subject so as to generate a sense signal. The above "is positioned" includes being placed at a specific location of the examined subject 170, including, for example, being placed/mounted/fixed/set on the examined subject 170, either directly or indirectly (e.g., through clothing on the body surface of the examined subject, a surface coil, etc.). For example, the sensor module 210 can be placed close to the chest cavity of the examined subject 170 to be able to more easily sense the motion caused by the heartbeat or respiration of the examined subject 170. The sensed signal generated by sensor module 210 can be transmitted via a wireless medium to a processor of the MR system, such as the physiological acquisition processor shown in FIG. 1. An example of the above wireless medium is Bluetooth, as using Bluetooth transmission can avoid the use of longer transmission lines, reduce the complexity of wiring, and better avoid signal interference in an MR environment, which can affect the quality of imaging. The wireless medium can also be other media capable of wireless signal transmission in an MR environment.

The power supply module 220 is configured to supply power to the sensor module 210. The shielding housing 230 forms the shielded space 231, and the power supply module 220 is provided in the shielded space 231 to insulate/shield the electromagnetic interference signals that may be generated by the power supply module 220 from the MR system.

In some embodiments, the sensor module 210 is also provided within the shielded space 231 of the shielding housing 230. For example, the sensor module 210 and the power supply module 220 are integrated with one another and provided together within the shielding housing 230. In such a manner, the need to set up an additional lead to provide power transmission from the power supply module 220 to the sensor module 210 is eliminated, thereby reducing design complexity and making it easy to implement.

As shown in FIG. 3, the physiological motion sensing apparatus further includes a Bluetooth antenna 240, and the shielding housing 230 is provided with a through hole 232, and the through hole 232 places the shielded space 231 of the shielding housing 230 in communication with the external environment of the shielding housing 230. One end of the Bluetooth antenna 240 connects to the sensor module 210 which is located in the shielded space 231, and the other end passes through the through hole 232. Thus, the signal generated by the sensor module 210 based on sensing the motion of the examined subject 170 can be transmitted to the outside of the shielding housing 230 through the Bluetooth antenna that passes through the through hole, and then received by a receiver module arranged outside. The length of the Bluetooth antenna may be sufficiently short, for example the end thereof may be just flush with the outer surface of the shielding housing 230, or only a short portion thereof may be exposed at the outer surface of the shielding housing 230. In other embodiments, however, the length of the Bluetooth antenna 240 or the length of the exposed portion thereof outside of the shielding housing 230 may be longer in order to improve signal transmission quality.

As shown in FIG. 3, in some embodiments, the shielding housing 230 includes a first portion 233 and a second portion 234 that are capable of joining one another to form the shielded space 231. In one example, the first portion 233 may include a columnar bottom having an opening to enable easier positioning in a predetermined location of a carrier (e.g., an examined subject body, clothing, or a surface coil placed on the surface of an examined subject body), and the opening may facilitate removal of components (e.g., at least one of the sensor module 210 and the power supply module 220) provided in the shielding housing 230 from the shielding housing 230 for operations such as maintenance, charging, etc. The columnar bottom may be a cylinder, a prism, or a structure having any other shaped planar support surface, and the second portion 234 may have any shape or structure that is compatible with the opening of the first portion 233. For example, the second portion 234 may serve as a cover portion of the first portion 233 and is capable of joining the edges of the opening of the first portion 233 to form the shielded space 231. In some embodiments, the first portion 233 and the second portion 234 can be at least partially separated to expose the shielded space 231. For example, the first portion 233 and the second portion 234 can be independent of one another, such that the second portion 234 can be completely detached from the first portion 233, and the first portion 233 and the second portion 234 can also be connected to one another, such that the second portion 234 is always connected to the first portion 233 whether in the closed or open state. In some embodiments, the first portion 233 and the second portion 234 may be joined or connected in any mechanical manner, for example, by snaps, screwing, wrapping, etc., and may be opened manually or automatically to expose the components in the shielded space 231. In other embodiments, the shielding housing 230 may have a greater number of joined portions, or may be molded in one piece to form a permanently-enclosed shielded space.

In some embodiments, the power supply module 220 may have a charging interface 221 so as to be able to obtain electrical power from an external source to provide to the sensor module 210. As described above, the power supply module 220 may be removed from the shielding housing 230 for an external charging operation or may be permanently enclosed within the shielding housing 230, and the shielding housing 230 may be provided with a sealable charging port 235, and the power supply module 220 may connect to an external charging device through the sealable charging port 235. For example, the power supply module 220 may have a USB interface that is provided at the charging port 235 of the shielding housing 230 to connect to a USB charging cable of the charging device. The charging port 235 can be sealed when no charging operation is being performed.

As shown in FIG. 3, the shielding housing 230 is provided with a connecting member 260, and the shielding housing 230 is positioned on a carrier by means of the connecting member 260, for example, on the surface coil 149 of the MR system. As described above, the surface coil 149 is configured to be placed on the surface of the examined subject 170, for example, over the chest cavity of the examined subject 170.

In some embodiments, the connecting member 260 includes a hook-and-loop fastener (or Velcro, toggle latch, etc.) that can join a hook-and-loop fastener also provided on the carrier to fix the physiological motion sensing apparatus 200. The connecting member 260 can also have other structures, such as a snap button that can be used in an MR environment.

FIG. 3 illustrates schematically only one example of a physiological motion sensing apparatus 400, the shape, scale, etc. of which is not intended to limit the present invention.

Figure 4:
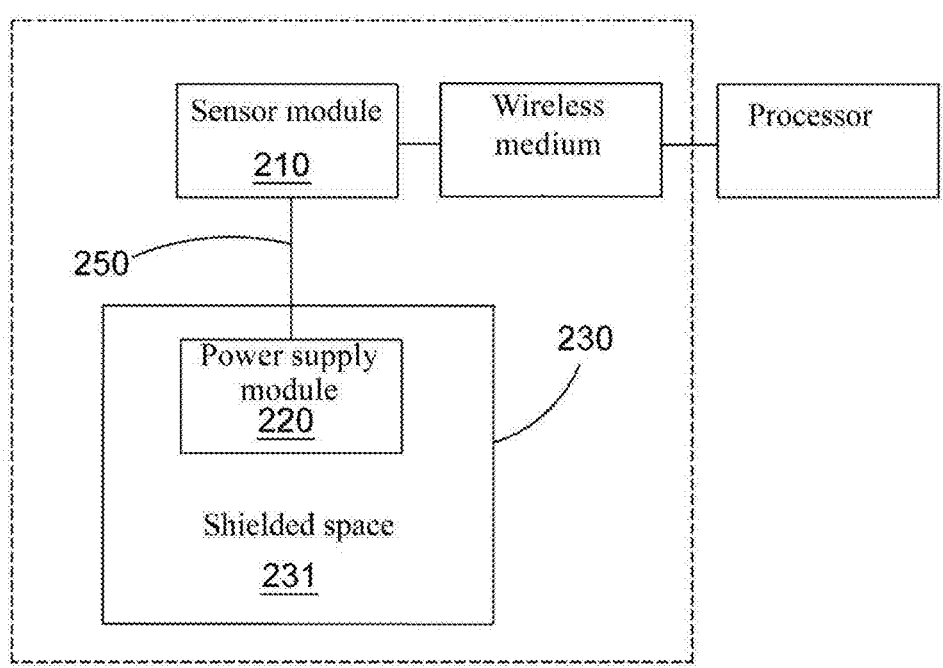
FIG. 4 illustrates a block diagram of a physiological motion sensing apparatus 400 according to another embodiment of the present invention.

FIG. 4 illustrates a block diagram of the physiological motion sensing apparatus 400 of another embodiment of the present invention, which is similar in structure and principle to the physiological motion sensing apparatus 200 of any of the above embodiments, with the difference that the sensor module 210 can be provided outside of the shielding housing 230, and the power supply module 220 inside of the shielding housing 230 and the sensor module 210 outside of the shielding housing 230 are connected by means of a lead 250 which passes through the shielding housing 230, and in such a manner, the size of the shielding housing 230 can be sufficiently small to accommodate only the size of the power supply module 220. For ease of design and to avoid signal interference, the length of the lead 250 is as short as possible.

In any of the above embodiments, the sensor module 210 is used to sense at least one of the respiratory motion and heartbeat motion of the examined subject 170 and is capable of generating a sense signal. The sense signal is transmitted to the processor of the MR system via a wireless medium. Through the study of the present invention, it was found that the acceleration brought about by the physiological motion of the examined subject can better reflect the respiratory motion, and the angular velocity brought about by the physiological motion can better reflect the heartbeat motion of the examined subject. Therefore, in the embodiments of the present invention, the sensor module 210 is configured to generate at least one of the acceleration signal and the angular velocity signal based on sensing the physiological motion of the examined subject, thereby enabling the processor to analyze the corresponding type of physiological motion based on at least one of the acceleration signal and the angular velocity signal.

Figure 5:
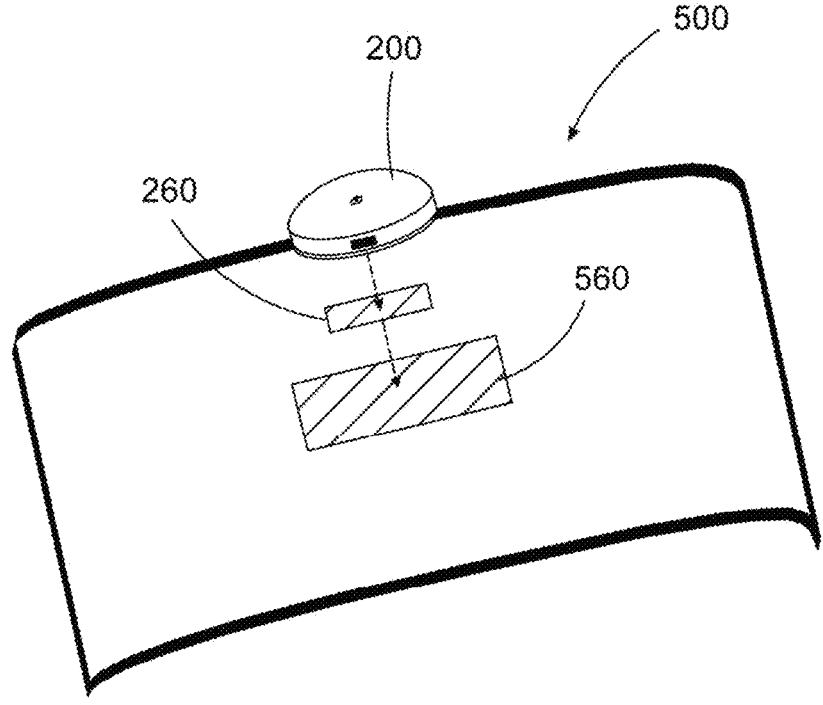
FIG. 5 illustrates an exemplary structural view of a surface coil 500 according to some embodiments of the present invention.

Referring to FIG. 5, based on the above description, embodiments of the present invention may also provide a surface coil 500 for the MR system, wherein an exploded schematic diagram of mounting the physiological motion detection apparatus 200 on the surface of the surface coil 500 is shown, and it should be understood that the physiological motion detection apparatus 400 may also be provided on the surface coil 500 in a similar manner. The operating principle of the surface coil 500 can be similar to that of the surface coil 149 in FIG. 1. The surface coil 500 is provided with a connecting part 560 which is configured to mount the physiological motion sensing apparatus 200 or 400 in any of the above embodiments. In some embodiments, the connecting part 560 is configured to mate with the connecting part 260 on the shielding housing 230, including, for example, a hook-and-loop fastener, etc. In other embodiments, the connecting part 560 may include a receiving member (not shown in the figure) provided on the surface of the surface coil 500, and the receiving member may, for example, have a wall extending outward or inward from the outer surface of the surface coil 500 and a slot formed by the wall, in which the shielding housing 230 may, for example, be directly placed without the use of the connecting part 260 for fixing.

In some embodiments, electrical power may be provided, via an electrical power transmission line between the surface coil 500 and the resonance assembly 140, to the physiological motion sensing apparatus 200 or 400 which is provided on the surface coil 500. For example, the power supply module 220 includes an interface for receiving power from the electrical power transmission line. The electrical power transmission line may be provided, for example, in whole or in part, on the patient positioning system 147.

Figure 6:
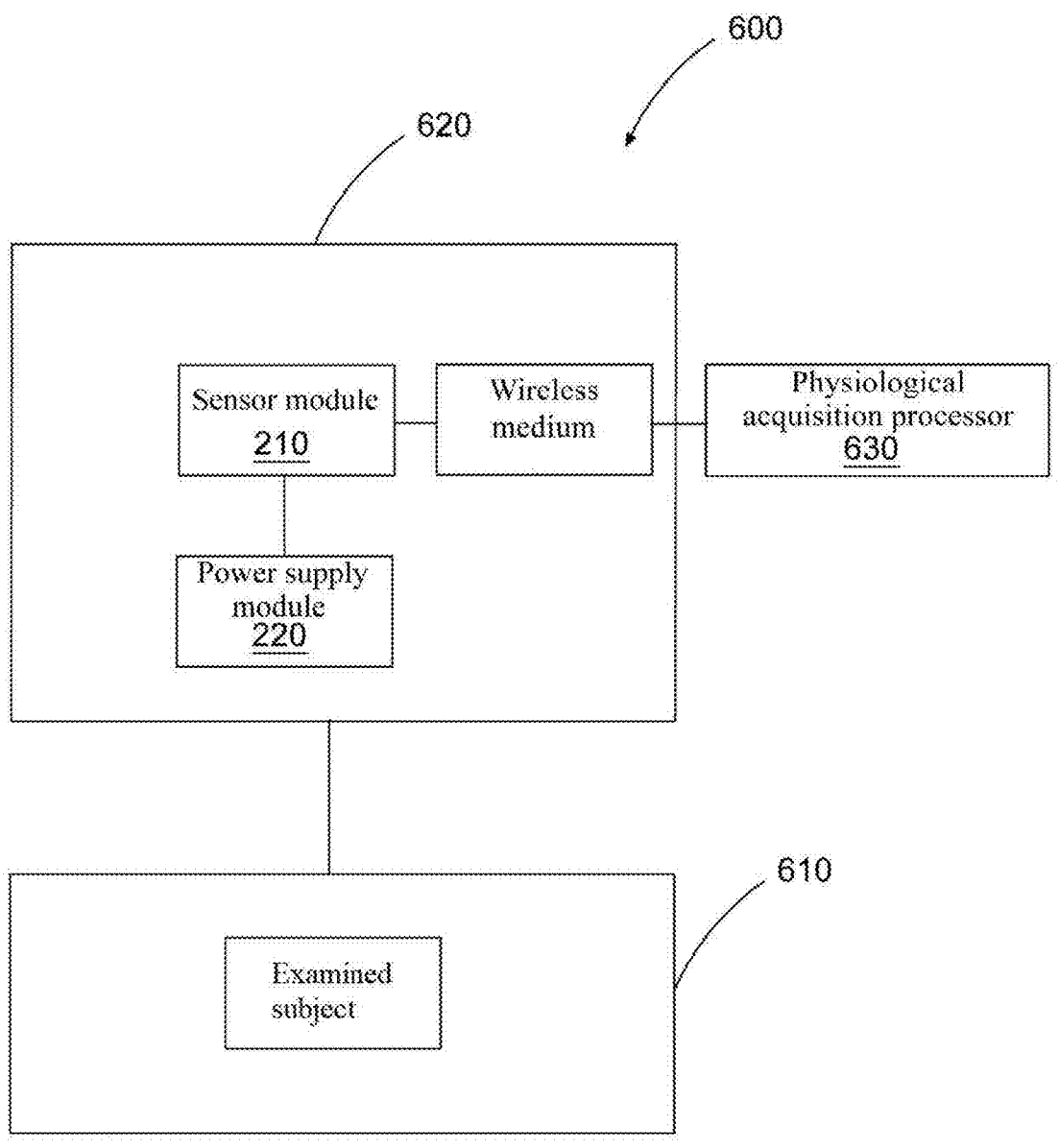
FIG. 6 illustrates a block diagram of a magnetic resonance system 600 according to another embodiment of the present invention.

Referring to FIG. 6, based on the above description, embodiments of the present invention may further provide an MR system 600 and the system 600 may be similar to the MR system 100 shown in FIG. 1, for example, may have all or some of the components of the system 100 shown in FIG. 1. The system 600 includes a scanner 610, a physiological motion sensing apparatus 620, and a physiological acquisition processor 630. The scanner 610 may include, for example, the resonance assembly 140 of FIG. 1, which is used to perform an MR scan of the examined subject. The physiological motion sensing apparatus 620 may include, for example, the physiological motion sensing apparatus 200 or 400. In some embodiments, the system 600 may also include the surface coil 500 which is provided with a physiological motion sensing apparatus. The physiological acquisition processor 630 may be similar to the physiological acquisition processor 155 in that the physiological acquisition processor 630 is configured to receive the sense signal from the sensor module 210 of the physiological motion sensing apparatus via a wireless medium, and to generate a physiological motion waveform of the examined subject based on the sense signal, the waveform being used to indicate, for example, the corresponding physiological motion cycle. For example, the physiological acquisition processor 630 may be provided with a Bluetooth receiver module that can be paired with, for example, a Bluetooth transmitter module provided in the sensor module 210 to transmit the sense signal.

Figure 7:
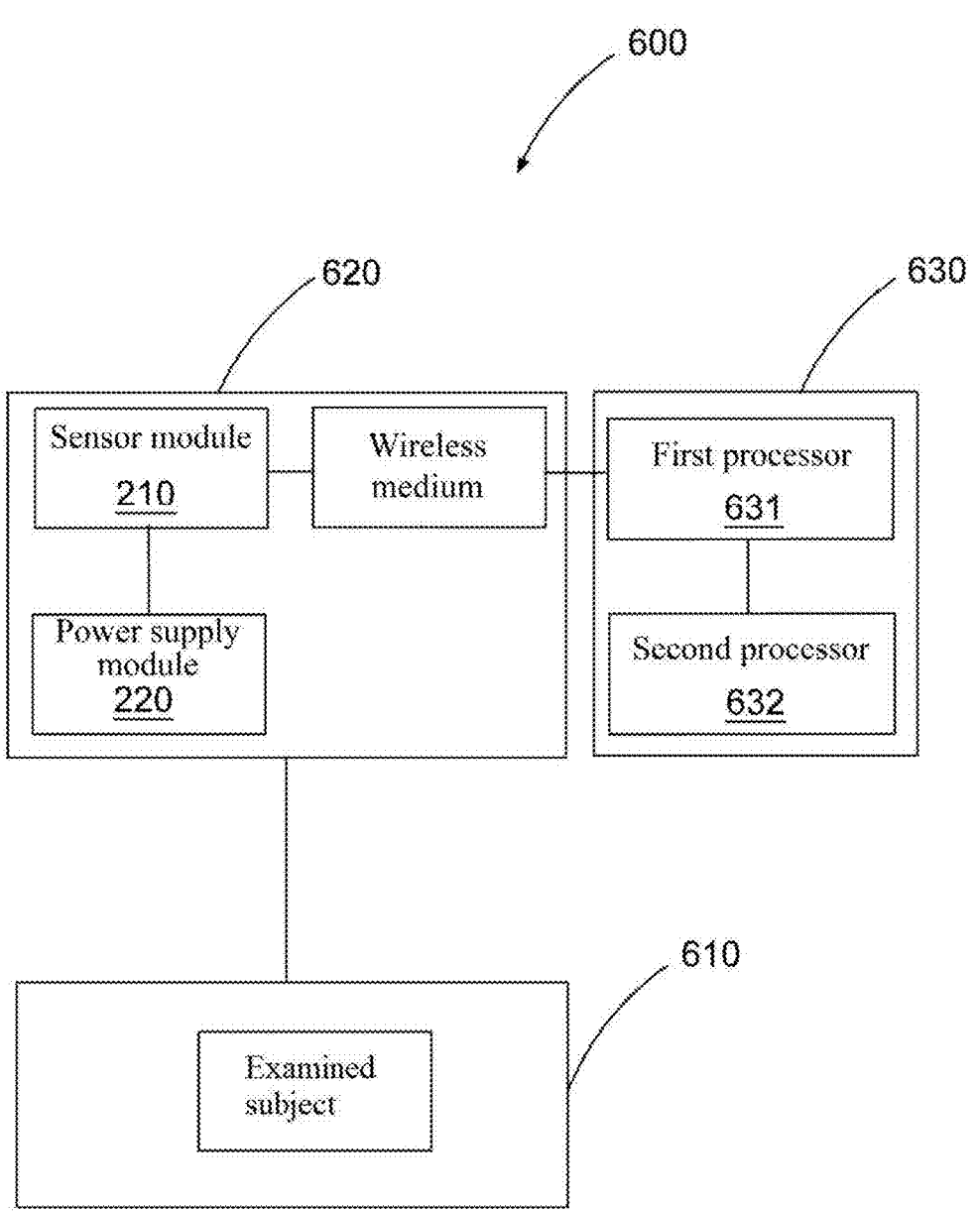
FIG. 7 illustrates a block diagram of the magnetic resonance system 700 according to some other embodiments of the present invention.

Referring to FIG. 7, in some embodiments, the physiological acquisition processor 630 includes a first processor 631 and a second processor 632, and the first processor 631 and the second processor 632 may each be provided in different spaces and transmit data via a signal transmission line or transmission network. For example, the first processor 631 may be provided in the scan room and the second processor 632 may be provided in the equipment room or the operation room. The first processor 631 is configured to receive the sense signal from the sensor module 210 of the physiological motion sensing apparatus and generate a physiological motion waveform, and the second processor 632 is configured to receive the physiological motion waveform and determine, based on the received physiological motion waveform, a trigger node for MR signal acquisition.

Figure 8:
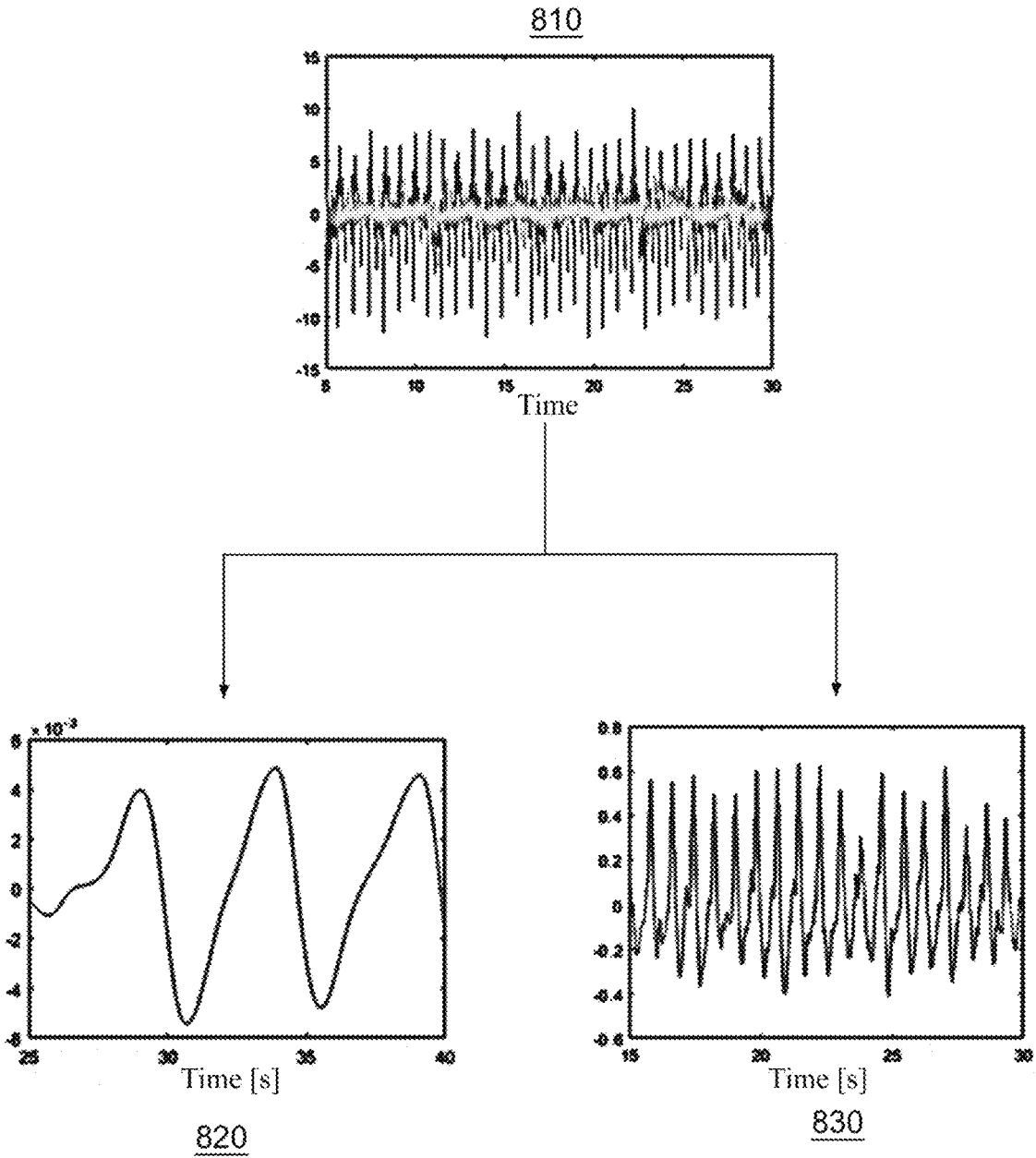
FIG. 8 illustrates an exemplary sense signal generated by a physiological motion monitoring apparatus based on an embodiment of the present invention.

In some embodiments, the physiological motion sensing apparatus 620 generates, based on sensing the physiological motion of the examined subject, a raw signal 810 such as the signal shown in FIG. 8, and processes the raw signal to extract from the signal an acceleration signal 820 and an angular velocity signal 830 as shown in FIG. 8, the processing of the raw signal including, but not limited to, filtering. The acceleration signal 820 is more robust over a wide range of low-frequency motion and is therefore used to acquire respiratory motion waveform processing in the embodiments of the present invention, and the angular velocity signal 830 is more sensitive to a narrow range of rotational motion and is therefore used to acquire cardiac motion waveform processing in the embodiments of the present invention.

Figure 9:
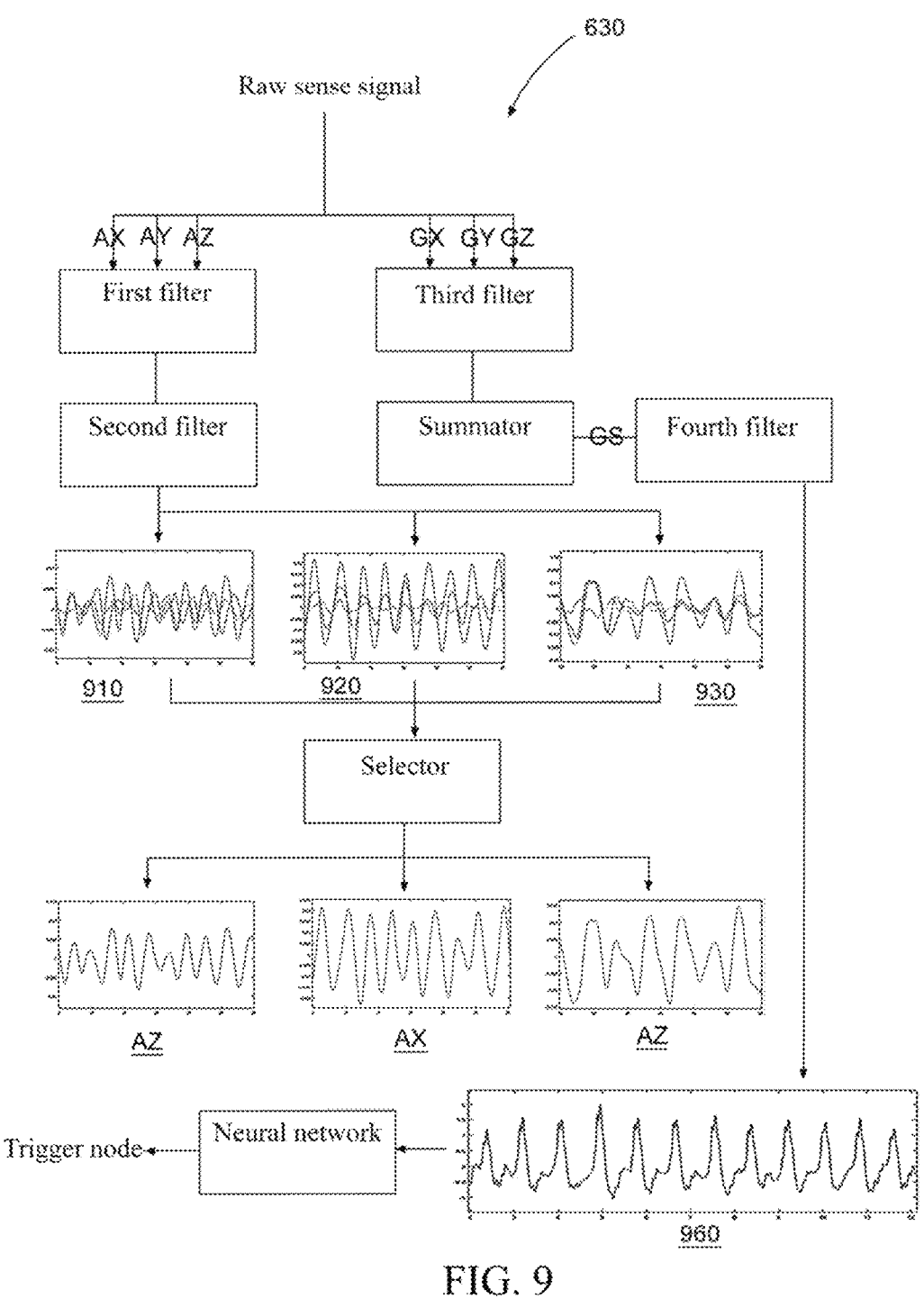
FIG. 9 illustrates an exemplary block diagram of the physiological acquisition processor of FIG. 6.

Referring to FIG. 9, in some embodiments, to enhance sensing accuracy, the physiological motion sensing apparatus 620 outputs sense signals in multiple directions to indicate the distribution of different physiological motions in different directions. For example, the acceleration signals include acceleration signals AX, AY, and AZ in three orthogonal directions forming a Cartesian coordinate system, and the angular velocity signals include angular velocity signals GX, GY, and GZ in three orthogonal directions forming a Cartesian coordinate system.

In some embodiments, the physiological acquisition processor 630 may include a first filter, a second filter, and a selector. As an example, the first filter, second filter, and selector may be integrated in the first processor 631. The first filter may be a bandpass filter having a first specific range of cutoff frequencies, which is used to perform a first filtering of the acceleration signals AX, AY, and AZ, respectively, and in some embodiments, the first filtering includes a multi-order bandpass filtering. The second filter may be a low-pass filter with a second specific range of cutoff frequencies, which is used to perform a second filtering of the acceleration signals AX, AY, and AZ, respectively, after undergoing the first filtering, which in some embodiments includes a multi-order low-pass filtering. The selector is configured to select at least one of the acceleration signals AX, AY, and AZ after the second filtering to be used as a respiratory motion waveform signal. In some embodiments, selections may be made based on the amplitude of the acceleration signals AX, AY, and AZ after going through at least one of the first filtering and the second filtering.

As shown in FIG. 9, when the physiological motion sensing apparatus 620 is placed in a first position such that the length, width, and height directions of the sensor module therein are parallel to the three orthogonal axes of the Cartesian coordinate system, one example of the generated acceleration signals AX, AY, and AZ is shown as in waveform 910, wherein the acceleration signal AZ has the largest amplitude, and therefore the selector outputs the acceleration signal AZ in the waveform 910 as the respiratory motion waveform signal. Specifically, the average amplitude or maximum amplitude of the three acceleration signals AX, AY, and AZ for the same time period can be compared, and the acceleration signal with the largest amplitude value among them is selected as the respiratory motion waveform.

When the physiological motion sensing apparatus 620 is placed in a second position such that the length and width directions of the sensor module therein form angles with the two orthogonal axes (X and Y axes) on the horizontal plane of the Cartesian coordinate system, respectively, one example of the generated acceleration signals AX, AY, and AZ is shown as in waveform 920, wherein the acceleration signal AX has the largest amplitude, and therefore the selector outputs the acceleration signal AX in the waveform 920 as the respiratory motion waveform signal.

When the physiological motion sensing apparatus 620 is placed in a third position such that the height direction of the sensor module therein forms an angle with the axis (Z axis) in the vertical direction of said Cartesian coordinate system, one example of the generated acceleration signals AX, AY, and AZ is shown as in waveform 930, wherein the acceleration signal AZ has the largest amplitude, and therefore the selector outputs the acceleration signal AZ in the waveform 930 as the respiratory motion waveform signal.

In some embodiments, the physiological acquisition processor 630 may include a third filter, a summator, and a fourth filter, and as an example, the third filter, summator, and fourth filter may be integrated in the second processor 632. The third filter may be a bandpass filter having a third specific range of cutoff frequencies, which is used to perform a third filtering of each of the angular velocity signals GX, GY, and GZ. In some embodiments, the third filtering includes a multi-order bandpass filtering. The summator is used to sum the angular velocity signals GX, GY, and GZ that have undergone the third filtering so as to acquire a summation signal GS, which may include, for example, calculating the sum of the square roots of the angular velocity signals GX, GY, and GZ. The fourth filter may be a bandpass filter having a fourth specific range of cutoff frequencies, which is used to perform a fourth filtering of the summation signal GS to obtain a heartbeat motion waveform, such as the waveform 960 in FIG. 9.

The heartbeat motion waveform can be used as a BCG (ballistocardiogram) and displayed on the user interface via the display of the MR system for monitoring the physical signs of the examined subject, such as heart rate, cardiac contraction, cardiac output, etc.

The physiological motion waveforms such as the respiratory motion waveform and heartbeat motion waveform acquired by the physiological acquisition processor 630 may further be used to determine the trigger node for MR signal acquisition, which may be achieved by, for example, the second processor 632. For example, the acquisition of the MR signal can be based on conventional respiratory gating methods that identify a more subdued phase of the respiratory motion waveform, e.g., by firing an RF excitation pulse and (e.g., after a specific time delay) acquiring the MR signal during the more subdued phase. Another example can be based on further analysis of the respiratory motion waveform or heartbeat motion waveform to determine which time points in that waveform (e.g., including the time points or the time period formed by such time points) are suitable for performing MR signal acquisition.

In some embodiments, the second processor 632 may include a trained neural network having an input end for receiving the physiological motion waveforms and an output end for outputting the trigger node for MR signal acquisition.

Machine learning can be performed based on priori sample information to train and form the neural network, and the trained neural network having suitable parameters can be applied to embodiments of the present invention to implement respiratory or heartbeat gating for MR acquisition. In some embodiments, an input data set on which the neural network is trained includes a first waveform, and an output data set on which the neural network is trained includes a plurality of first trigger nodes determined in the first waveform based on a plurality of second trigger nodes, wherein the plurality of second trigger nodes are determined based on a second waveform acquired synchronously with the first waveform, and wherein the second trigger nodes are synchronized with the first waveform. The first waveform is a physiological motion waveform obtained based on an embodiment of the present invention, such as at least one of the respiratory motion waveform and heartbeat motion waveform, and the plurality of groups of second waveforms are physiological waveforms obtained (or pre-obtained) by known methods, which may include, for example, finger pulse waveforms, ECG (electrocardiogram) waveforms, etc.

Figure 10:
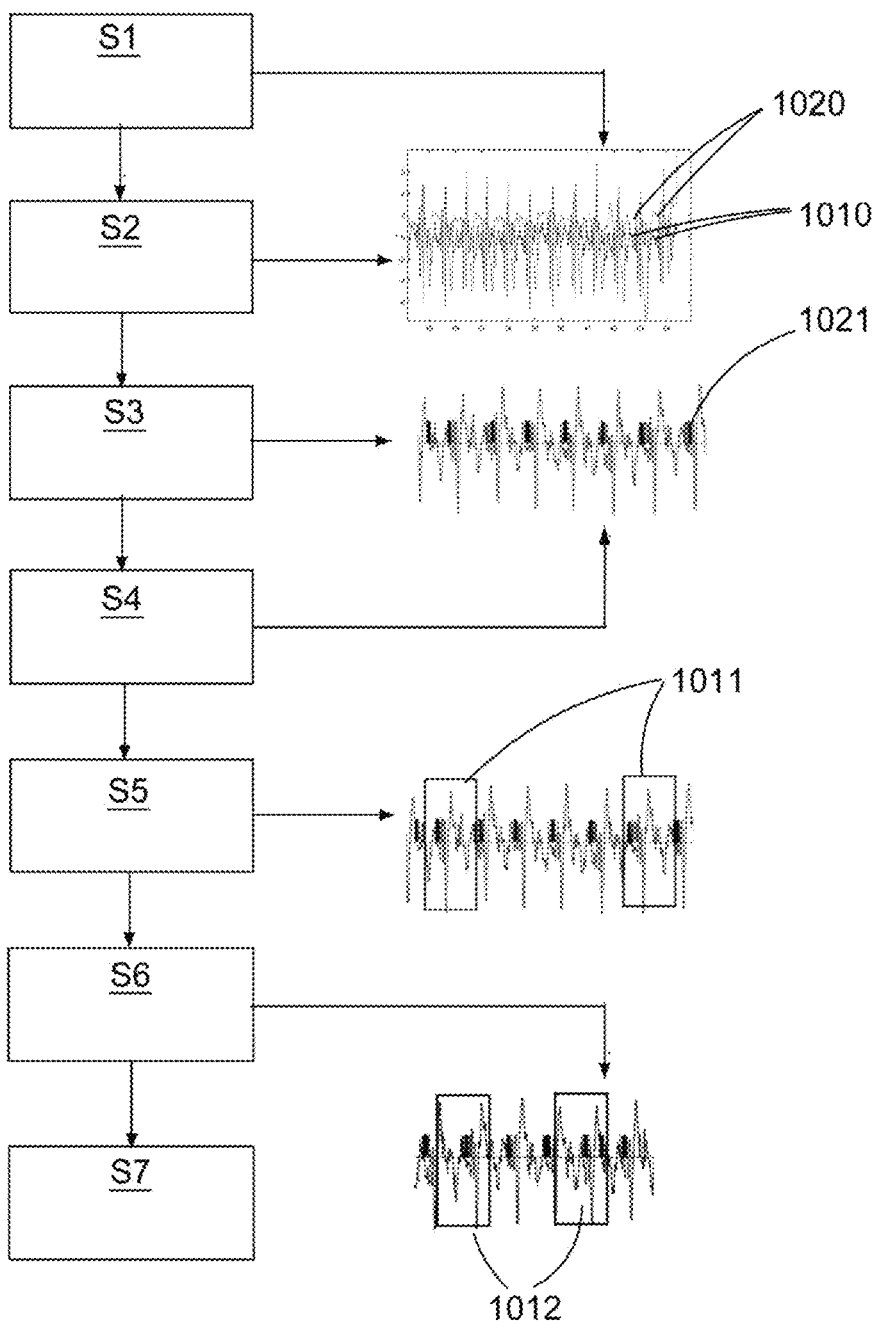
FIG. 10 illustrates a flow chart of a training method of the neural network in FIG. 9.

Although FIG. 9 illustrates an example of using a processed angular velocity signal as the input data set of the neural network to determine the trigger node, the raw sense signal (e.g., any of the raw angular velocity signals GX, GY, and GZ) can be used as the input of the neural network, for example, a first waveform 1010 of the example in FIG. 10 is an unprocessed angular velocity signal.

Similarly, deep learning of raw or processed acceleration signals can be used to obtain trigger nodes using neural network techniques.

Referring to FIG. 10, in some examples, training the neural network may include the following steps—Step S1: obtaining a second waveform, which may be, for example, an ECG waveform 1020 obtained by ECG monitoring. Step S2: obtaining a first waveform 1010, such as a heartbeat motion waveform, based on an embodiment of the present invention, wherein the first waveform 1010 and the second waveform 1020 are obtained synchronously. Step S3: obtaining a plurality of trigger time points for MR acquisition gating, which are determined based on the second waveform, i.e., second trigger points 1021. Step S4: synchronizing the second trigger points 1021 and the first waveform 1010.

Step S5: identifying a plurality of trigger data 1011 in the first waveform 1010, for example, waveforms in the first waveform 1010 that lie within a first specific time period (e.g., 10 milliseconds) before each second trigger point 1021 may be identified as the trigger data, and in some embodiments, waveforms in the first waveform 1010 that lie within a time period (e.g., ±5 milliseconds) before and after each second trigger point 1021 may also be identified as the trigger data.

Step S6: obtaining a plurality of non-trigger data 1012 identified in the first waveform 1010, for example, a plurality of waveform segments in the first waveform 1010 may be identified as the non-trigger data, wherein the time endpoint of each waveform segment is greater than a specific value (e.g., 10 milliseconds) from any of the second trigger points 1021.

Step S7: using the first waveform 1010 as an input data set for a neural network and the plurality of trigger data and plurality of non-trigger data as an output data set of the neural network, and performing machine learning on the neural network to obtain a neural network having optimized parameters.

As discussed herein, the neural network technology (also referred to as deep learning, deep machine learning, hierarchical learning, deep structured learning, etc.) can employ an artificial neural network which performs leaning and processing on the input data. The deep learning method is characterized by using one or a plurality of network architectures to extract or simulate data of interest. The deep learning method may be implemented using one or a plurality of layers (such as an input layer, a normalization layer, a convolutional layer, and an output layer, where different deep learning network models may have different numbers or functions of layers), wherein the configuration and number of the layers allow the deep learning network to process complex information extraction and modeling tasks. Specific parameters (also referred to as "weight" or "bias") of the network are usually estimated through a so-called learning process (or training process). The learned or trained parameters usually result in (or output) a network corresponding to layers of different levels, so that extraction or simulation of different aspects of initial data or the output of a previous layer usually may represent the hierarchical structure or concatenation of layers. Thus, processing may be performed layer by layer. That is, "simple" features may be extracted from input data for an earlier or higher-level layer, and then these simple features are combined into a layer exhibiting features of higher complexity. In practice, each layer (or more specifically, each "neuron" in each layer) may process input data as output data for representation using one or a plurality of linear and/or non-linear transformations (so-called activation functions). The number of the plurality of "neurons" may be constant among the plurality of layers or may vary from layer to layer.

As discussed herein, as part of initial training of a machine learning process to solve a specific problem, a training data set for a machine training model consists of a known input value and an expected (target) output value finally outputted from the machine learning process. In this manner, a deep learning algorithm can process the training data set (in a supervised or guided manner or an unsupervised or unguided manner) until a mathematical relationship between a known input and an expected output is identified and/or a mathematical relationship between the input and output of each layer is identified and represented. In the learning process, (part of) input data is usually used, and a network output is created for the input data. Afterwards, the created network output is compared with the expected output of the data set, and then the difference between the created and expected outputs is used to iteratively update network parameters (weight and/or bias). A stochastic gradient descent (SGD) method may usually be used to update network parameters. However, those skilled in the art should understand that other methods known in the art may also be used to update network parameters. Similarly, a separate validation data set may be used to validate a trained network, where both a known input and an expected output are known. The known input is provided to the trained network so that a network output can be obtained, and then the network output is compared with the (known) expected output to validate prior training and/or prevent excessive training.

Once the machine learning model is created or trained, the corresponding classification results, including the trigger points and the non-trigger points of the MR acquisition, can be obtained by simply inputting the waveforms obtained through the embodiments of the present invention and the prior samples into the model. The foregoing can be achieved by, for example, learning the characteristics of the waveform data at these trigger points. The model can be integrated with the processor of the MR system (e.g., the physiological acquisition processor or any other processor), at which point the corresponding trigger point classification results can be obtained simply by inputting the data into the integrated module.

In some embodiments, the trained neural network model is obtained based on training by a training module on an external carrier (e.g., a device outside the MRI system). In some embodiments, the training system may include a first module configured to store a training data set, a second module configured to perform, based on a model, training and/or an update, and a communication network configured to connect the first module and the second module. In some embodiments, the first module includes a data transmission unit and a first storage unit, wherein the first storage unit is configured to store a training data set, and the data transmission unit is configured to receive a relevant instruction (e.g., for acquiring the training data set) and send the training data set according to the instruction. In addition, the second module includes a model update unit and a second storage unit, wherein the second storage unit is configured to store a training model, and the model update unit is configured to receive a relevant instruction and perform training and/or an update of the network, etc. In some other embodiments, the training data set may further be stored in the second storage unit of the second module, and the training system may not include the first module. In some embodiments, the communication network may include various connection types, such as wired or wireless communication links, or fiber-optic cables.

Once data (e.g., a trained network or model) are generated and/or configured, the data may be replicated and/or loaded into the MRI system, which may be accomplished in different manners. For example, communications between different components may be accomplished through a directional connection or link loading model between the MRI system and the computer, or may be accomplished by using an available wired and/or wireless connection and/or based on any suitable communication (and/or network) standard or protocol. Optionally, the data may be indirectly loaded into the MRI system. For example, the data may be stored in a suitable machine-readable medium (for example, a flash memory card), and then the medium is used to load the data into the MRI system (for example, by a user or an authorized person of the system on site); or the data may be downloaded to an electronic device (for example, a laptop computer) capable of local communication, and then the device is used on site (for example, by a user or an authorized person of the system) to upload the data to the MRI system via a direct connection (for example, a USB connector).

Referring to FIG. 11, a physiological motion gating method 1100 for the MR system of an embodiment of the present invention is illustrated, wherein, at step 1101, a sense signal is generated based on the physiological motion sensing apparatus of any of the above embodiments; at step 1103, the sense signal is received from the physiological motion sensing apparatus via a wireless medium; and at step 1105, a physiological motion waveform of a examined subject is generated based on the sense signal.

In some embodiments, step 1107 is further included to determine a trigger node for MR signal acquisition based on the generated physiological motion waveform, and specifically, the physiological motion waveform is received by a trained neural network, and the trigger node is outputted.

In some embodiments, step 1101 may include: the physiological motion sensing apparatus generating a raw signal 810 based on sensing the physiological motion of the examined subject, and processing the raw signal 810 to extract an acceleration signal 820 and an angular velocity signal 830 therefrom.

The acceleration signal 820 may further include acceleration signals AX, AY, and AZ in three orthogonal directions of a Cartesian coordinate system, and the angular velocity signal 830 may further include angular velocity signals GX, GY, and GZ in three orthogonal directions of a Cartesian coordinate system.

Step 1105 may include: multi-order bandpass filtering of the acceleration signals AX, AY, and AZ, respectively; multi-order low-pass filtering of the acceleration signals AX, AY, and AZ, respectively, after undergoing the multi-order bandpass filtering. The step 1105 may further include selecting at least one of the acceleration signals AX, AY, and AZ that have undergone the multi-order low-pass filtering as a respiratory motion waveform signal. The following may be included: comparing the average amplitude or maximum amplitude of the three acceleration signals AX, AY, and AZ for the same time period, and selecting the acceleration signal having the highest amplitude value thereamong as the respiratory motion waveform.

Step 1105 may further include: multi-order bandpass filtering of the angular velocity signals GX, GY, and GZ, respectively. Further the step 1105 include summing the angular velocity signals GX, GY, and GZ that have undergone the multi-order bandpass filtering to obtain a summed signal GS; and multi-order bandpass filtering of the summed signal GS to obtain a heartbeat motion waveform signal.

In some embodiments, the physiological motion gating method 1100 may further include: displaying the heartbeat motion waveform signal on a user interface via a display of the MR system.

In the above embodiments of the present invention, the physiological motion sensing apparatus can be placed relative to the examined subject (e.g., on the body of the examined subject or the surface coil) without the need to establish a connection with the examined subject by means of, for example, electrodes, thereby saving time and labor costs and improving the user experience.

The application of a motion sensing apparatus for motion monitoring in the MR environment is achieved by using the shielding housing to shield the possible interference signals caused by the power supply module, while ensuring that the signals sensed by the sensor module can be transmitted to an external processor, so that the associated physiological motions can be analyzed and potential interference artifacts can be avoided. Comparing waveforms 1210 with 1220 as illustrated in FIG. 12, it can be seen that the effect on the generated motion waveform during MR scanning is minimal.

The physiological motion sensing apparatus transmits the sense signal through a wireless medium, thereby avoiding the use of a long transmission lead and simplifying the system design.

It is possible to extract data related to different types of physiological motions, such as heartbeat and respiration, from the sense signal of the physiological motion sensing apparatus, so that the different types of physiological motion-related data have the same source and the synchronized data are more accurate, and it is easy to perform at the same time the gating trigger of the MR acquisition based on the different types of physiological motion-related data.

Figure 13:
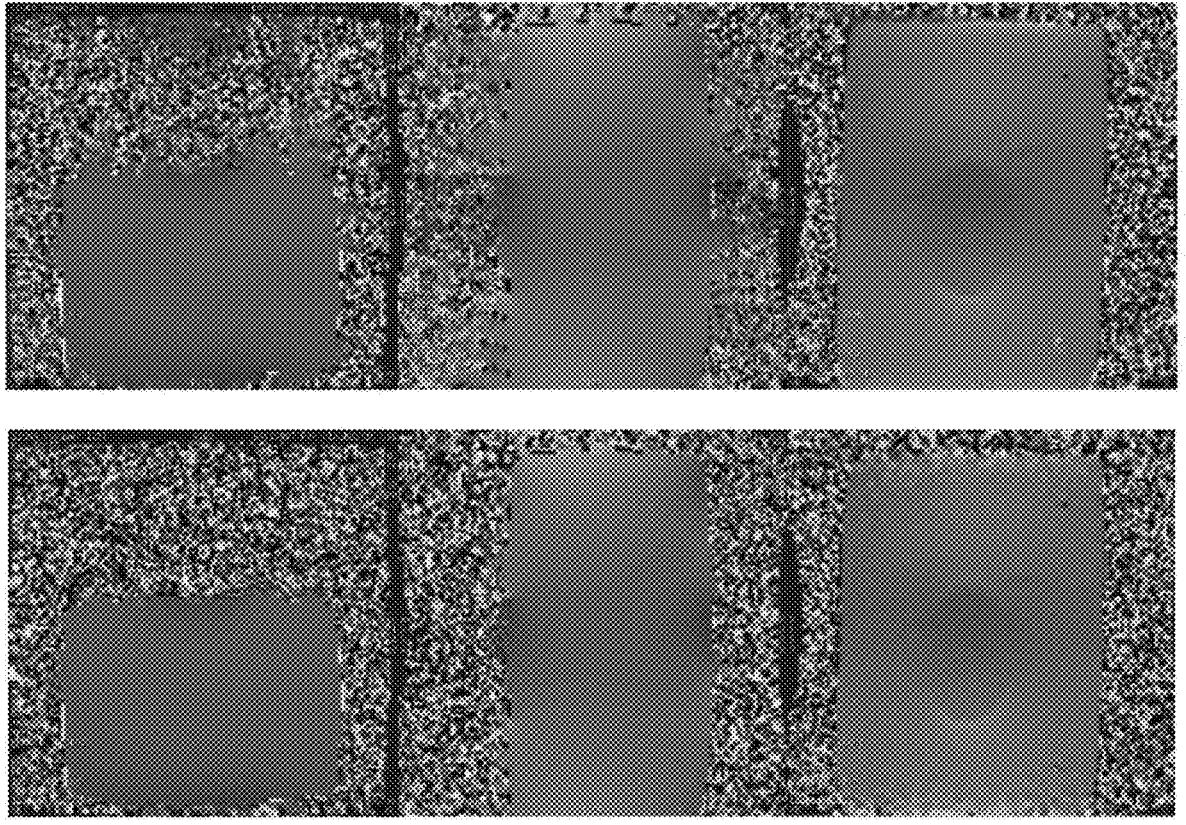
FIG. 13 illustrates an example of a magnetic resonance image acquired using a surface coil according to an embodiment of the present invention.

In the embodiments of the present invention, the physiological motion sensing apparatus can be more easily mounted on the surface coil by means of the connecting member such as a hook-and-loop fastener, which is easy to use. Referring to the MR image illustrated in FIG. 13, it can be seen that providing the physiological motion sensing apparatus on the surface coil has no or minimal effect on the imaging.

In the embodiments of the present invention, the physiological acquisition processor employs the trained neural network to perform deep learning of the generated motion waveforms in order to generate gating trigger data for MR signal acquisition, thereby avoiding complex data processing, and the motion waveforms and trigger data in the input data of the neural network are synchronized with the trigger data obtained using methods in the prior art, thus making it possible to achieve at least the same gating trigger effect as in the prior art.

In addition to any previously indicated modifications, many other variations and replacement arrangements may be devised by those skilled in the art without departing from the substance and scope of the present description, and the appended claims are intended to encompass such modifications and arrangements. Therefore, although the information has been described above in specifics and detailed terms in connection with what is currently considered to be the most practical and preferred aspects, it will be apparent to those of ordinary skill in the art that many modifications can be made, including but not limited to the form, function, mode of operation, and use, without departing from the principles and concepts set forth herein. Likewise, as used herein, in all respects, the examples and embodiments are intended to be illustrative only and should not be construed as limiting in any way.

The purpose of providing the above specific embodiments is to facilitate understanding of the content disclosed in the present invention more thoroughly and comprehensively, but the present invention is not limited to these specific embodiments. Those skilled in the art should understand that various modifications, equivalent replacements, and changes can also be made to the present invention and should be included in the scope of protection of the present invention as long as these changes do not depart from the spirit of the present invention.

The invention claimed is:

1. A physiological motion sensing apparatus for a magnetic resonance system, wherein the apparatus comprises:
   a sensor module, positioned relative to an examined subject of the magnetic resonance system, the sensor module being configured to sense the motion of the examined subject to generate a sense signal and transmit the sense signal to a processor of the magnetic resonance system via a wireless medium;
   a power supply module, configured to supply power to the sensor module; and
   a shielding housing, forming a shielded space, the power supply module being provided in the shielded space.

2. The apparatus according to claim 1, wherein the sensor module is provided in the shielding housing, the shielding housing being provided with a through hole, and the apparatus further comprises:
   a Bluetooth antenna, configured to communicate with the processor so as to transmit the sense signal, one end of the Bluetooth antenna being connected to the sensor module and the other end passing through the through hole.

3. The apparatus according to claim 1, wherein the shielding housing is provided with a sealable charging port and the power supply module is configured to connect to an external charging device via the charging port.

4. The apparatus according to claim 1, wherein the sensor module is provided outside the shielding housing and is connected to the power supply module by means of a power transmission line passing through the shielding housing.

5. The apparatus according to claim 1, wherein the shielding housing comprises at least two portions capable of joining one another to form the shielded space, and the at least two portions are provided to be capable of being at least partially separated to expose the shielded space.

6. The apparatus according to claim 1, wherein the shielding housing is provided with a connecting member, the shielding housing being positioned on a surface coil of the magnetic resonance system by the connecting member, and the surface coil being configured to be placed on a surface of the examined subject.

7. The apparatus according to claim 1, wherein the sense signal comprises a signal generated based on sensing at least one of respiratory motion and heartbeat motion of the examined subject.

8. The apparatus according to claim 1, wherein the sense signal comprises at least one of an acceleration signal and an angular velocity signal generated based on the sensed physiological motion of the examined subject.

9. The apparatus according to claim 8, wherein the acceleration signal comprises acceleration signals in three directions forming a Cartesian coordinate system, and the angular velocity signal comprises angular velocity signals in three directions forming a Cartesian coordinate system.

10. The apparatus according to claim 1, wherein the wireless medium comprises Bluetooth.

11. A surface coil for a magnetic resonance system, the surface coil being provided with the physiological motion sensing apparatus according to claim 1 mounted thereon.

12. A surface coil for a magnetic resonance system, the surface coil being provided with a connecting part thereon, the connecting part of the surface coil being configured to mount the physiological motion sensing apparatus according to claim 1.

13. A magnetic resonance system, comprising:
   a scanner, configured to perform magnetic resonance scanning on an examined subject;
   the physiological motion sensing apparatus according to claim 1; and
   a physiological acquisition processor, the physiological acquisition processor comprising a first processor configured to receive, via a wireless medium, the sense signal from the sensor module of the physiological motion sensing apparatus and, based on the sense signal, generate a physiological motion waveform of the examined subject.

14. The system according to claim 13, wherein the physiological acquisition processor further comprises:
   a second processor, configured to receive the physiological motion waveform and, based on the physiological motion waveform, determine a trigger node for magnetic resonance signal acquisition.

15. The system according to claim 14, wherein the second processor comprises a trained neural network, an input end of the neural network being configured to receive the physiological motion waveform, and an output end being configured to output the trigger node.

16. The system according to claim 15, wherein an input data set for training the neural network comprises a first waveform, and an output data set for training the neural network comprises a plurality of first trigger nodes determined in the first waveform based on a plurality of second trigger nodes, wherein the plurality of second trigger nodes are determined based on a second waveform acquired synchronously with the first waveform, the first waveform being the physiological motion waveform, and the second waveform being a physiological waveform obtained by a known method.

17. The system according to claim 16, wherein the second waveform comprises a heartbeat waveform obtained by at least one of a finger pulse measurement and an electrocardiogram measurement.

18. A physiological motion gating method for a magnetic resonance system, comprising:

generating a sense signal on the basis of the physiological motion sensing apparatus according to claim 1;

receiving the sense signal from the physiological motion sensing apparatus via a wireless medium; and generating a physiological motion waveform of the examined subject based on the sense signal.

19. The method according to claim 18, further comprising:

determining a trigger node for magnetic resonance signal acquisition based on the physiological motion waveform, comprising: receiving, by means of a trained neural network, the physiological motion waveform and outputting the trigger node.

\* \* \* \* \*